United States Patent
Chen et al.

(10) Patent No.: US 7,964,862 B2
(45) Date of Patent: Jun. 21, 2011

(54) PHASE CHANGE MEMORY DEVICES AND METHODS FOR MANUFACTURING THE SAME

(75) Inventors: Frederick T Chen, Hsinchu (TW); Yen Chuo, Taipei (TW); Hong-Hui Hsu, Changhua County (TW); Jyi-Tyan Yeh, Hsinchu (TW); Ming-Jinn Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 528 days.

(21) Appl. No.: 12/056,227

(22) Filed: Mar. 26, 2008

(65) Prior Publication Data

US 2008/0265238 A1 Oct. 30, 2008

(30) Foreign Application Priority Data

Apr. 24, 2007 (TW) .............................. 96114371 A (51) Int. Cl.
*H01L 47/00* (2006.01)
(52) U.S. Cl. .................. 257/4; 257/3; 257/5; 438/102; 438/103; 438/652
(58) Field of Classification Search .................. 257/3, 4, 257/5, 42, E31.029, E21.075; 438/102, 103, 438/652
See application file for complete search history.

(56) References Cited

U.S. PATENT DOCUMENTS

| 5,789,758 | A | 8/1998 | Reinberg |
| 6,908,829 | B2 | 6/2005 | Hussein et al. |
| 7,791,058 | B2 * | 9/2010 | Liu ................................... 257/2 |
| 7,803,657 | B2 * | 9/2010 | Choi et al. .................... 438/102 |
| 2007/0158862 | A1 | 7/2007 | Lung |

FOREIGN PATENT DOCUMENTS

| TW | 200625604 A | 7/2006 |
| TW | 2007/0158862 A1 | 6/2007 |
| TW | 200721464 A | 6/2007 |
| TW | 200733353 A | 9/2007 |

* cited by examiner

*Primary Examiner* — Zandra Smith
*Assistant Examiner* — Telly D Green (57) ABSTRACT

Phase change memory devices and methods for manufacturing the same are provided. An exemplary embodiment of a phase change memory device includes a first electrode disposed in a first dielectric layer. A second dielectric layer is disposed over the first dielectric layer and the first electrode. A phase change material layer disposed in the second dielectric layer to electrically contact the first electrode. A third dielectric layer is disposed over the second dielectric layer. A second electrode is disposed in the third dielectric layer to electrically connect the phase change material layer and at least one gap disposed in the first dielectric layer or the second dielectric layer to thereby isolate portions of the phase change material layer and portions of the first or second dielectric layer adjacent thereto.

13 Claims, 10 Drawing Sheets

PHASE CHANGE MEMORY DEVICES AND METHODS FOR MANUFACTURING THE SAME

BACKGROUND

The invention relates to memory devices and more particularly to phase change memory (PCM) devices and methods for manufacturing the same.

Phase change memory devices are non-volatile, highly readable, highly programmable, and require a lower driving voltage/current. Current trends in phase change memory development are to increase cell density and reduce current density thereof.

Phase change material in a phase change memory device has at least two solid phases, a crystalline state and an amorphous state. Transformation between these two phases can be achieved by changing the temperature of the phase change material. The phase change material exhibits different electrical characteristics depending on its state. For example, in the amorphous state the material exhibits a higher resistivity than in the crystalline state. Such phase change material may switch between numerous electrically detectable conditions of varying resistivity on a nanosecond time scale with the input of pico joules of energy. Chalcogenide material is a popular and widely used phase change material in modern phase change memory technology. Since phase change material allows a reversible phase transformation, memory bit status can be distinguished by determining the phase of the phase change material in the memory bit.

Figure 1:
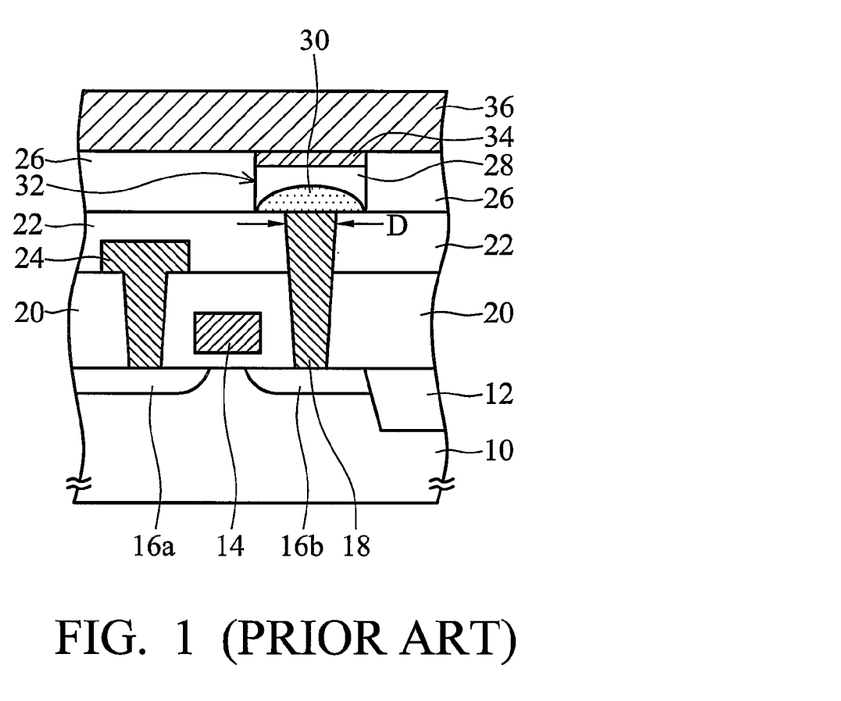
FIG. 1 shows a cross section of a conventional phase change memory cell

FIG. 1 partially shows a cross sectional view of a conventional phase change memory (PCM) cell. As shown in FIG. 1, an isolation structure 12 is located at a predetermined region of a semiconductor substrate 10 to thereby define an active region. A source region 16a and a drain region 16b are disposed in and separated by a distance in the active region. A gate 14, functioning as a word line, is disposed across the active region between the source region 16a and the drain region 16b. The gate 14, the source region 16a and the drain region 16b form a transistor. The semiconductor substrate 10 having the transistor thereon is covered with an insulating layer 20. An interconnect line 24 is disposed over the insulating layer 20. The interconnect line 24 is electrically connected to the drain region 16b through a contact hole penetrating the insulating layer 20. Another insulating layer 22 covers the interconnect line 24. A heating plug 18 is disposed in the insulating layers 22 and 20, electrically contacting the drain region 16b. A patterned phase change material layer 28 and a top electrode 34 are sequentially stacked over the insulating layer 22, wherein a bottom surface of the phase change material layer pattern 28 is in contact with the heating plug 18. Another insulating layer 26 is disposed on the insulating layer 22. A bit line 36 is located on the insulating layer 26 and is in contact with the top electrode 34.

In a write mode, the transistor is turned on and a large current flows through the heating plug 18, thus heating an interface between the phase change material layer 28 and the heating plug 18, thereby transforming an active portion 30 of the phase change material layer 28 into either the amorphous state or the crystalline state depending on the length of time and amount of current flowing through the heating plug 18.

Figure 2:
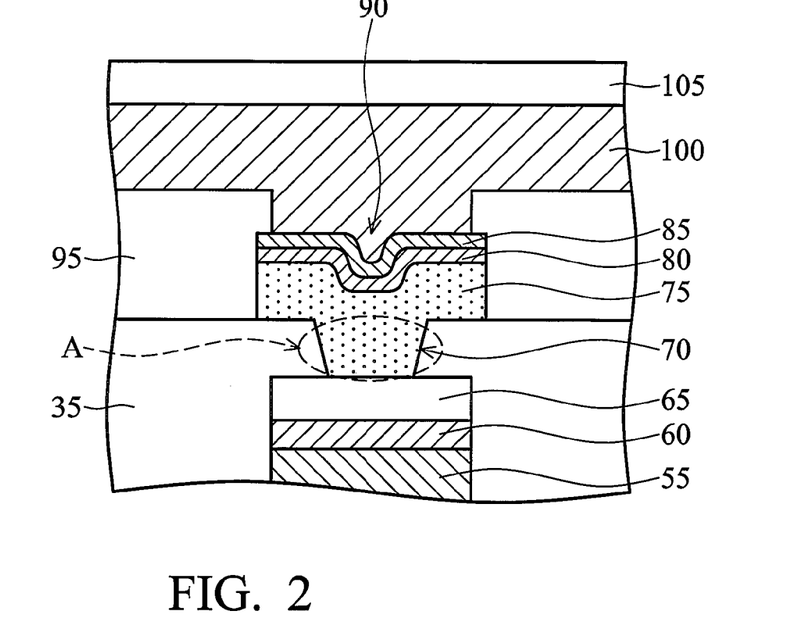
FIG. 2 is cross section showing another conventional phase change memory cell.

FIG. 2 partially shows a cross sectional view of a conventional phase change memory cell as illustrated in U.S. Pat. No. 5,789,758 issued to Reinberg. As shown in FIG. 2, a phase change memory cell 90 includes a plurality of sequentially stacked bottom electrode contact layers 55, 60 and 65 embedded in an oxide layer 35. The bottom electrode contact layer 65 comprises a phase change material. An opening 70 is formed in the oxide layer 35 and the opening 70 exposes a part of the bottom electrode contacting layer 65. A phase change material layer 75, a upper contact electrode layer of carbon 80 and a upper contact electrode of molybdenum 85 are sequentially formed over the oxide layer 35, wherein the phase change material layer 75 fills the opening 70 and physically contacts the phase change material in the underlying bottom electrode contact layer 65. The phase change material layers, upper contact electrode of carbon 80 and the upper contact electrode of molybdenum 80 are partially covered by an oxide layer 95. An aluminum conductor 100 is formed over the oxide layer 95. The aluminum conductor 100 is partially disposed in the oxide layer 95 and electrically contacts the upper contact electrode of molybdenum 85. A top encapsulating layer 105 is formed over the aluminum conductor 100. In a write mode, the portion of the phase change material layer 75 in an active region A in the opening 70 of the phase change memory cell illustrated in FIG. 2 is heated, thereby transforming the portion of the phase change material layer 27 therein into either the amorphous state or the crystalline state depending on the length of time and amount of current flowing through the phase change material layer 27.

SUMMARY

An exemplary embodiment of a phase change memory device comprises a first electrode disposed in a first dielectric layer, a second dielectric layer is disposed over the first dielectric layer and the first electrode, a phase change material layer disposed in the second dielectric layer to electrically connect the first electrode, a third dielectric layer disposed over the second dielectric layer, a second electrode disposed in the third dielectric layer to electrically connect the phase change material layer and at least one gap disposed in the first dielectric layer or the second dielectric layer to thereby isolate portions of the phase change material layer and portions of the first or second dielectric layer adjacent thereto.

Another exemplary embodiment of a phase change memory device comprises a first electrode disposed in a first dielectric layer, a second dielectric layer disposed over the first dielectric layer and the first electrode, and an I-shaped phase change material layer disposed in the second dielectric layer, electrically contacting the first electrode, a third dielectric layer disposed over the second dielectric layer and the I-shaped phase change material layer, a second electrode disposed in the third dielectric layer to electrically connect the phase change material layer, a spacer layer at least disposed between portions of the second portion of the I-shaped phase change material layer and the second dielectric layer and at least one gap disposed between the spacer layer and the second dielectric layer. In one embodiment, the I-shaped phase change material layer comprises a first portion of a first width contacting the first electrode, a second portion of a second width disposed on a portion of the first portion and a third portion of a third width disposed on the second portion and partially contacting the second portion, wherein the second width is less than the first width and the third width.

Yet another exemplary embodiment of a phase change memory device comprises a first electrode disposed in a first dielectric layer. A second dielectric layer is disposed over the first dielectric layer and the first electrode. A phase change material layer is disposed in the second dielectric layer, electrically contacting the first electrode. A third dielectric layer is disposed over the phase change material layer and the second dielectric layer. A second electrode is disposed in the third dielectric layer, electrically contacting the phase change material layer. At least one gap is disposed in the first dielectric layer to thereby isolate portions of a bottom surface of the phase change material layer with the first dielectric layer.

An exemplary embodiment of a method for manufacturing a phase change memory device comprises providing a first dielectric layer with a first electrode formed therein. A second dielectric layer is formed over the first dielectric layer with a first phase change material layer formed therein, wherein the first phase change material layer electrically contacts the first electrode and has a first width. A second phase change material layer is formed over the first phase change material layer to partially overlie the first phase change material layer, wherein the second phase change material layer has a second width less than the first width. A spacer layer and a sacrificial layer are formed over the second phase change material layer, wherein the spacer layer and the sacrificial layer sequentially overlie a sidewall of the second phase change material layer and expose a top surface of the second phase change material layer. A third dielectric layer is formed over the second dielectric layer and the first phase change material layer, wherein the first phase change material layer surrounds the spacer layer and are substantially coplanar with the spacer layer, the sacrificial layer and the second phase change material layer. A fourth dielectric layer is formed over the third dielectric layer and an opening is formed in the fourth dielectric layer to expose the second phase change material layer, the sacrificial layer, the spacer layer and portions of the third dielectric layer. The sacrificial layer is removed to form a seam between the third dielectric layer and the spacer layer and a third phase change material layer is formed in the opening, wherein the third phase change material layer electrically connects the second phase change material layer and seals the seam to form a gap, and the third phase change material layer has a third width greater than the second width. A second electrode is formed over the third phase change material layer to electrically connect the third phase change material layer.

Another exemplary embodiment of a method for manufacturing a phase change memory device comprises providing a first dielectric layer with a first electrode formed therein. A second dielectric layer formed with a first phase change material layer is disposed therein is formed over the first dielectric layer, wherein the first phase change material layer electrically contacts the first electrode and has a first width. A third dielectric layer is formed over the second dielectric layer and the first phase change material layer. The third dielectric layer is defined to form a first opening in a portion thereof and a dielectric plug at the center of the first opening, wherein the first opening exposes portions of the second dielectric layer and the first phase change material layer and the dielectric plug partially covers the first phase change material layer. A second phase change material layer is conformably formed over the third dielectric layer and the dielectric plug, and in the first opening to cover the second dielectric layer and the first phase change material layer. A spacer layer and a sacrificial layer are formed in the first opening, surrounding and covering the third dielectric layer and a portion of the second phase change material layer disposed along a sidewall of the dielectric plug in the first opening. A dielectric material is formed over the first opening and over the sacrificial layer, the spacer layer and the second phase change material layer. A planarization step is performed to remove portions of the dielectric material, the sacrificial layer, the second phase change material layer over the third dielectric layer to form a fourth dielectric layer in the first opening, thereby exposing portions of the sacrificial layer, the spacer layer and the second phase change material layer. A fifth dielectric layer is blanketly formed over the third dielectric layer. A second opening is formed in the fifth dielectric layer to expose the dielectric plug and a portion of the second phase change material layer, the spacer layer, the sacrificial layer and the third dielectric layer adjacent to the dielectric plug. The sacrificial layer is removed to form a seam between the third dielectric layer and the spacer layer. A third phase change material layer is formed in the second opening, wherein the third phase change material layer seals the seam to form a gap between the fourth dielectric layer and the second phase change material layer. A second electrode is formed over the third phase change material layer to electrically connect the third phase change material layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 9~16 are schematic diagrams showing different manufacturing steps of a PCM device according to yet another embodiment of the invention, wherein FIGS. 9, 11, 13 and 15 are schematic top views and FIGS. 10, 12, 14 and 16 show schematic cross sections.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Phase change memory (PCM) devices and methods for manufacturing the same are described in the following with reference to FIGS. 3~17.

Figure 3:
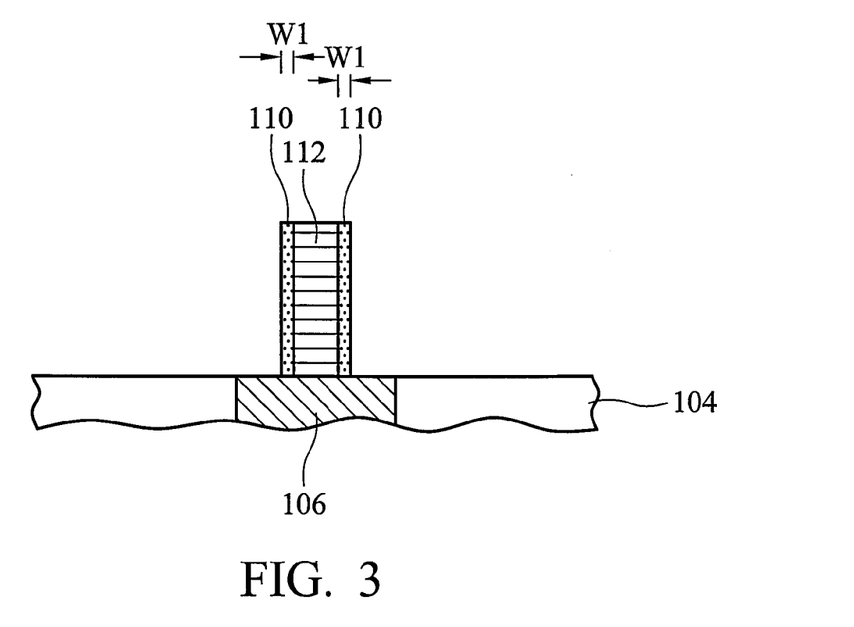
FIGS. 3~4 are schematic diagrams showing different manufacturing steps of a phase change memory (PCM) device according to an embodiment of the invention.
Figure 4:
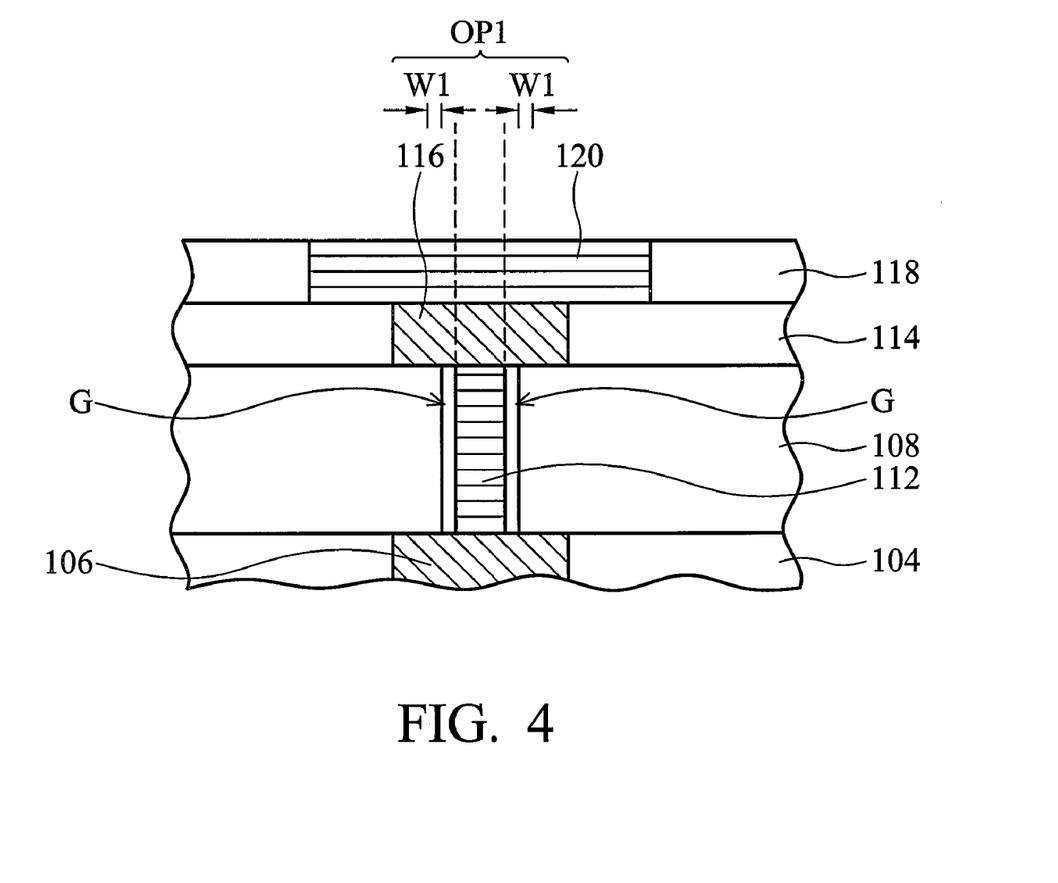

FIGS. 3~4 show schematic cross sections of different manufacturing steps of a PCM device according to an exemplary embodiment of the invention. Herein, FIGS. 3~4 only illustrate manufacturing of a phase change memory cell in a phase change memory device. Note that the phase change memory device in this embodiment further comprises other conductive components (e.g. interconnection plugs or interconnecting lines) for electrically connecting the phase change memory cell with an active device (e.g. transistor or diode) and a conductive line. These conductive components, however, are not shown in FIGS. 3~4 for simplicity.

In FIG. 3, a cross section showing a part of a phase memory cell of a phase change memory device according to an exemplary embodiment is illustrated. As shown in FIG. 3, a substantially fabricated phase change memory cell structure is provided, comprising a conductive layer 106 formed in a dielectric layer 104 and a first electrode 112 formed over the dielectric layer 114. The first electrode 112 is stacked over portions of the conductive layer 106 and is formed with a sacrificial layer 110 overlying sidewalls thereof. The sacrificial layer 110 is now formed with a width W1 and a top surface of the first conductive electrode 112 is now exposed. Herein, the width W1 of the sacrificial layer 110 is preferably not greater than half the width of the first electrode 112.

In FIG. 4, a layer of dielectric material is formed over the dielectric layer 104, the first electrode 112 and the sacrificial layer 110. The dielectric material can be, for example, borophosphosilicate glass (BPSG), silicon oxide or spin on glass (SOG). Next, a planarization step (not shown) such as an etching back or a chemical mechanical polishing process is performed to remove the portion of the dielectric material over the first electrode 112 and the sacrificial layer 110, thereby leaving a dielectric layer 108 surrounding the first electrode 112 and the sacrificial layer 110. Herein, the dielectric layer 108 is coplanar with the first electrode 112 and the sacrificial layer 110.

As shown in FIG. 4, a dielectric layer 114 is then formed over the dielectric layer 108, the first electrode 112 and the sacrificial layer 114. The dielectric layer 114 may comprise borophosphosilicate glass (BPSG), silicon oxide or spin on glass (SOG). A photolithography step and a sequential etching step (not shown) are then performed to form an opening OP1 in the dielectric layer 114 and exposes the first electrode 112, the sacrificial layer 110 and portions of the dielectric layer 108 adjacent to the first electrode 112 and the sacrificial layer 110. Next, a film removal process (not shown) such as an etching process is performed to remove the sacrificial layer 110 and form a seam G between the dielectric layer 108 and the first electrode 112. The seam G extends downward to the conductive layer 106 and has a width W1 the same as that of the sacrificial layer 110.

Herein, the first electrode 112 may comprise conductive material such as Ti, Cu, Al, W or alloys thereof. The dielectric layers 104, 108 and the sacrificial layer 110 may comprise dielectric material such as borophosphosilicate glass (BPSG), silicon oxide or spin on glass (SOG). Preferably, the sacrificial layer 110 and the dielectric layer 104 may comprise different dielectric materials to provide proper etching selectivity thus forming a sacrificial layer 110 along sidewalls of the first electrode 112.

In FIG. 4, a phase change material layer 116 is next formed in the opening OP1. The phase change material layer 116 may comprise chalcogenide materials such as Ge—Te—Sb trinary chalcogenide compound or Te—Sb binary chalcogenide compound and can be formed by a method such as physical vapor deposition (PVD). Because PVD can be used, step coverage performance in the opening OP1 may be not adequate and the width of the seam G may be small, the phase change material layer 116 is thus not formed in the seam G during deposition thereof. Next, a dielectric layer 118 is formed over the dielectric layer 114 and the phase change material layer 116. An opening (not shown) is then formed in the dielectric layer 118 and a second electrode 120 is formed in the opening by sequential photolithography and etching steps (not shown), thereby leaving a structure as shown in FIG. 4.

As shown in FIG. 4, the first electrode 112 of the phase change memory cell may function as a heating electrode. In the embodiment of FIG. 4, the phase change material layer 116 can be totally or partially isolated from the first electrode 112 and the dielectric layer 108 adjacent thereto by the seam G. Air or a vacuum is left in the space in seam G, thus forming a gap G between the first electrode 112 and the dielectric layer 108. During write mode operation, heat loss from the part of the phase change material layer 116 heated by the first electrode 112 adjacent to the dielectric layer 108 can be thus prevented, thereby improving heating efficiency of the heating electrode and reducing power consumption when compared with the conventional phase change memory cell. In some embodiments, the gap G may be disposed around the heating electrode 112.

FIGS. 5~8 show schematic cross sections of different manufacturing steps of a PCM device according to another exemplary embodiment of the invention. Herein, FIGS. 5~8 only illustrate manufacturing of a phase change memory cell in a phase change memory device. It is noted that the phase change memory device in this embodiment further comprises other conductive components (e.g. interconnection plugs or interconnecting lines) for electrically connecting the phase change memory cell with an active device (e.g. transistor or diode) and a conductive line. These conductive components, however, are not shown in FIGS. 5~8 for simplicity.

Figure 5:
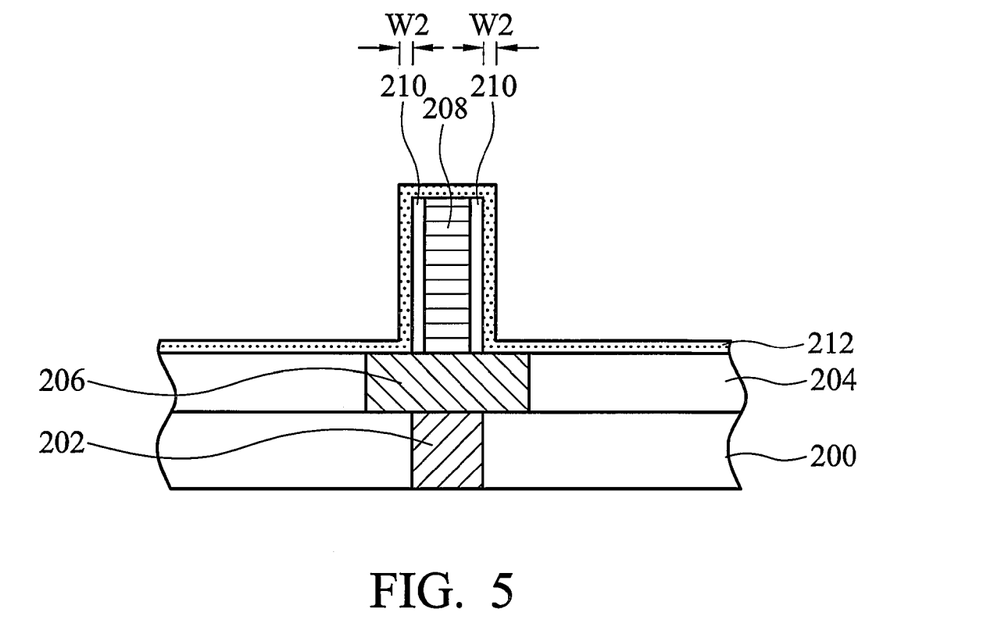
FIGS. 5~8 are schematic diagrams showing different manufacturing steps of a PCM device according to another embodiment of the invention.

FIG. 5 shows a cross section of another embodiment of a phase change memory cell of a phase change memory device. As shown in FIG. 5, a substantially fabricated phase change memory cell is first provided, comprising a first electrode 202 formed in a dielectric layer 200 and a patterned first phase change material layer 206 and second phase change material layer 208 sequentially stacked over the dielectric layer 200. The first phase change material layer 206 is disposed in a dielectric layer 204 and the second phase change material layer 208 is stacked over portions of the first phase change material layer 206. A spacer layer 210 is formed on each sidewall of the first phase change material layer 208. In addition, a sacrificial layer 212 is conformably formed over the spacer layer 210, the second phase change material layer 208, the first phase change material layer 206 and the dielectric layer 204, having a width/thickness W2. Herein, the width/thickness W2 of the sacrificial layer 212 is preferably not greater than the width of the spacer layer 210.

Herein, the first electrode 202 may comprise conductive materials such as Ti, Cu, Al, W or alloys thereof. The first and second phase change material layer 206 and 208 may comprise chalcogenide material such as Ge—Te—Sb ternary chalcogenide compound or Te—Sb binary chalcogenide compound. The dielectric layers 200, 204, the spacer layer 210 and the sacrificial layer 212 may comprise dielectric material such as borophosphosilicate glass (BPSG), silicon oxide or spin on glass (SOG). Preferably, the spacer layer 210 and the sacrificial layer 212 may comprise different dielectric materials to provide proper etching selectivity therebetween.

Figure 6:
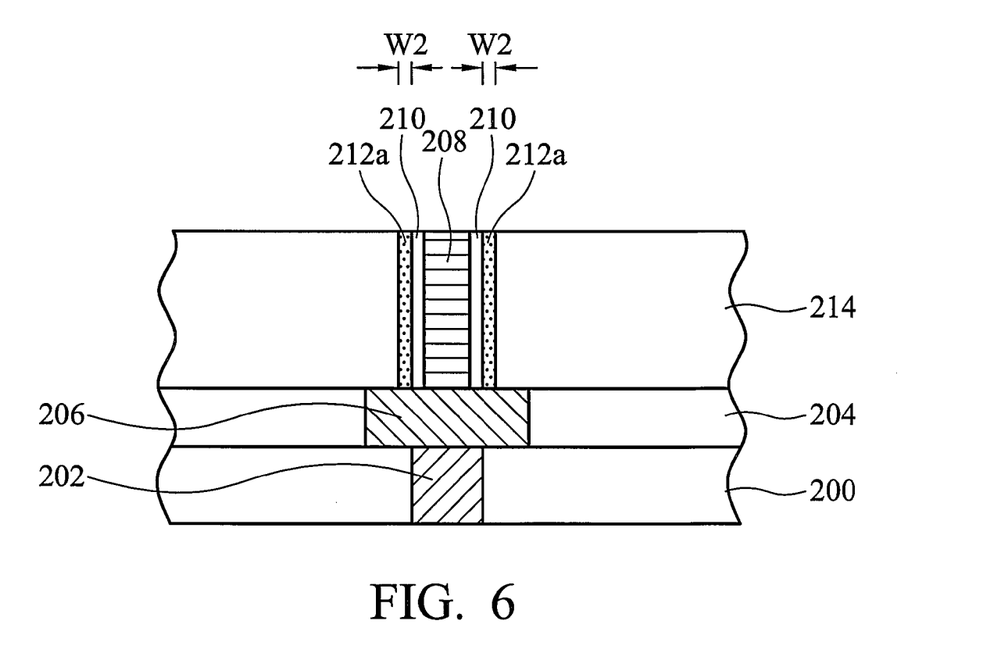

In FIG. 6, an etching step (not shown) is then performed to etch back the sacrificial layer 212, thereby leaving a sacrificial layer 212a on each sidewall of the spacer layer 210. A layer of dielectric material is then formed over the dielectric layer 204, the second phase change material layer 208, the spacer layer 210 and the sacrificial layer 212a. The dielectric material can be, for example, borophosphosilicate glass (BPSG), silicon oxide or spin on glass (SOG). Next, a planarization step (not shown) such as an etching back or a chemical mechanical polishing process is performed to remove the portion of the dielectric material over the second phase change material layer 208, the spacer layer 210 and the sacrificial layer 212, thereby leaving a dielectric layer 214 surrounding the second phase change material layer 208, the sacrificial layer 212a and the spacer layer 210. Herein, the dielectric layer 214 is substantially coplanar with the second phase change material layer 208, the spacer layer 210 and the sacrificial layer 212a.

The dielectric layer 214, the sacrificial layer 212a and the spacer layer 210 preferably comprises different dielectric material to provide proper etching selectivity and to form the spacer layer 210 and the sacrificial layer 212a only on sidewalls of the second phase change material layer 208.

Figure 7:
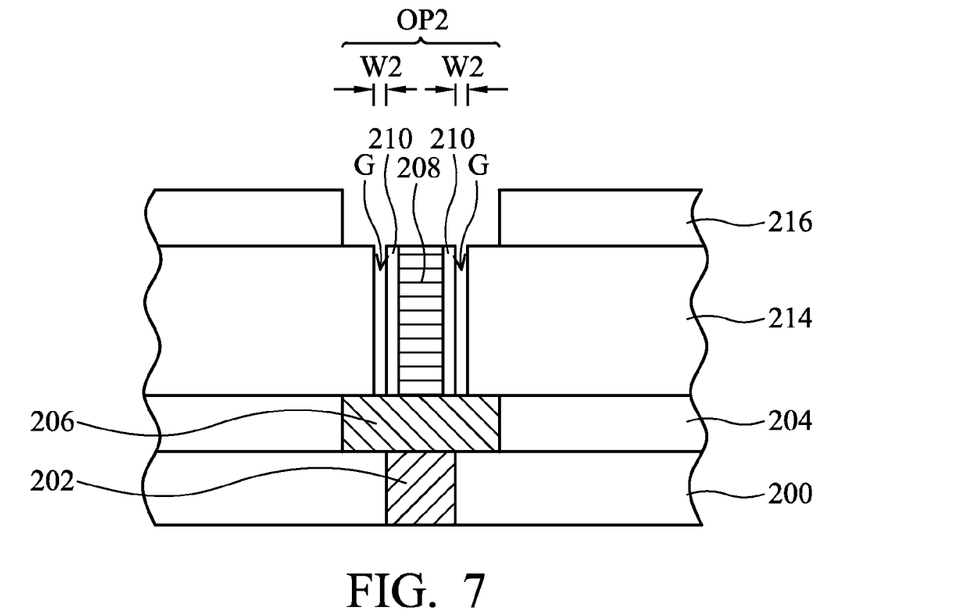

In FIG. 7, a dielectric layer 216 is then formed over the dielectric layer 214, the second phase change material layer 208, the spacer layer 210 and the sacrificial layer 212a. The dielectric layer 216 preferably comprises dielectric material different from that of the dielectric layer 214. A photolithography step and a sequential etching step (not shown) are then performed to form an opening OP2 in the dielectric layer 216 and the opening OP2 exposes the second phase change material layer 208, the spacer layer 210, the sacrificial layer 212a and portions of the dielectric layer 214 adjacent to the second phase change material layer 208, the spacer layer 210 and the sacrificial layer 212a. Next, a film removal process (not shown) such as an etching process is performed to remove the sacrificial layer 212a and leaves a seam G between the dielectric layer 214 and sidewalls of the spacer layer 210. The seam G extends downward to the first phase change material layer 206 and has a width W2 the same as that of the sacrificial layer 212a.

Figure 8:
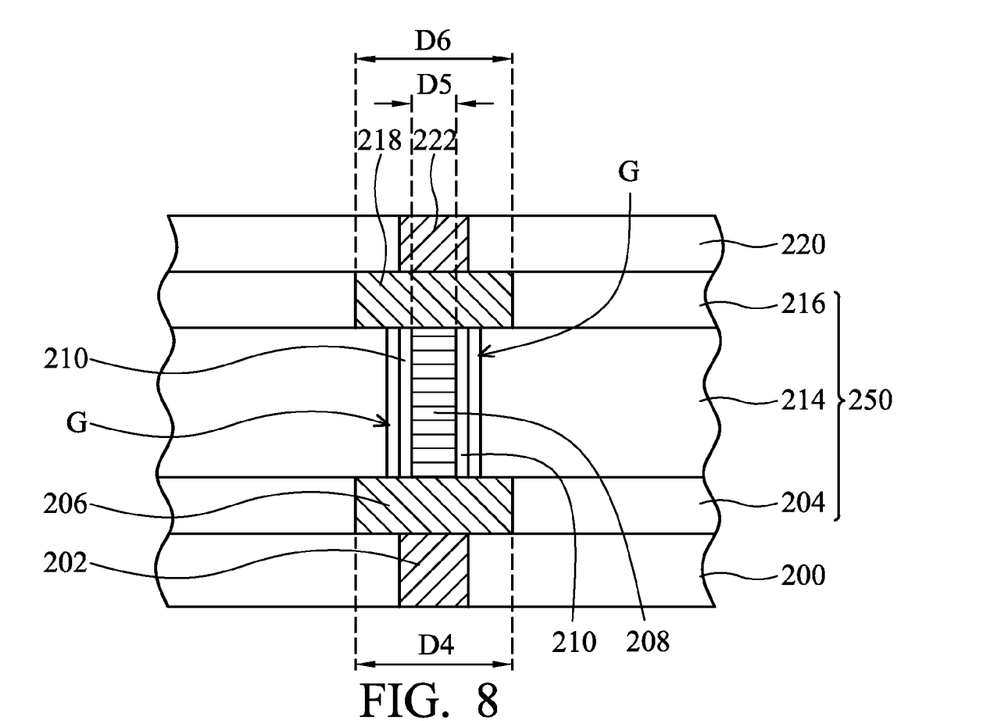

In FIG. 8, a third phase change material layer 218 is formed in the opening OP2. The third phase change material layer 218 may comprise the same material as that of the first phase change material layer 206 and the second phase change material layer 208 and can be formed by methods such as PVD. Because PVD may be used, step coverage performance in the opening OP2 is not adequate and the seam G is formed with a small width, the third phase change material layer 218 may thus not be formed in the seam G during deposition thereof. Next, a dielectric layer 220 is formed over the dielectric layer 216 and the third phase change material layer 218 and an opening (not shown) is next formed in the dielectric layer 220 by sequential photolithography and etching steps (not shown). A second electrode 222 is then formed in the opening.

As shown in FIG. 8, the third phase change material layer 218, the second phase change material layer 208 and the first phase change material layer 206 form a composite phase change material layer of the phase change memory cell, having a substantially I-shaped configuration in cross section. The third phase change material layer 218, the second phase change material layer 208 and the first phase change material layer 206 have a third width D6, second width D5 and first width D4, respectively, wherein the second width D5 is less than the third width D6 and the first width D4 and the third width D6 can be the same as or different from the first width D4. Preferably, the first width D4 is the same as the third width D6 and the second width D5 is less than the first width D4 and the third width D6. The first electrode 202 and the second electrode 222 in this embodiment of the phase change memory cell may function as a heating electrode. Those skilled in the art will recognize that the electrodes can be connected with other conductive components according to design. In this embodiment, the composite phase change material layer substantially comprises three phase change material sub-layers of different widths. Herein, the third sub-layer (i.e. the third phase change material layer 218) and the first sub-layer (i.e. the first phase change material layer 206) have a width greater than the second sub-layer (i.e. the second phase change material layer 208). The phase change material layer of such a configuration allows current concentration on the second sub-layer and the adjacent portions thereof, thereby achieving a high current density for allowing writing operations. The second sub-layer may thus function as an active region for determining bit status. Moreover, the second sub-layer and adjacent dielectric layer 214 are now isolated from each other by the seam G and the space in the seam G is now left with air or is under vacuum, thereby forming a gap between the heating electrode and the dielectric layer 214. During a write mode operation, heat loss from the part of the phase change material layer heated by the heating electrode on the adjacent dielectric layer 214 can be thus prevented, thereby improving heating efficiency of the heating electrode and reducing power consumption when compared with a conventional phase change memory cell. In addition, the spacer layer 210 formed over sidewalls of the second sub-layer of this composite phase change material layer further provides a structural supplement to the overlying layer and may prevent collapse thereof.

FIGS. 9~16 are schematic diagrams showing different manufacturing steps of an embodiment of a PCM device, wherein FIGS. 9, 11, 13 and 15 are top views and FIGS. 10, 12, 14 and 16 are cross sectional views. Herein, FIGS. 9~16 only illustrate manufacturing of a phase change memory cell in a phase change memory device. Note that the phase change memory device in this embodiment further comprises other conductive components (e.g. interconnection plugs or interconnecting lines) for electrically connecting the phase change memory cell with an active device (e.g. transistor or diode) and a conductive line. These conductive components, however, are not shown in FIGS. 9~16 for simplicity.

Figure 9:
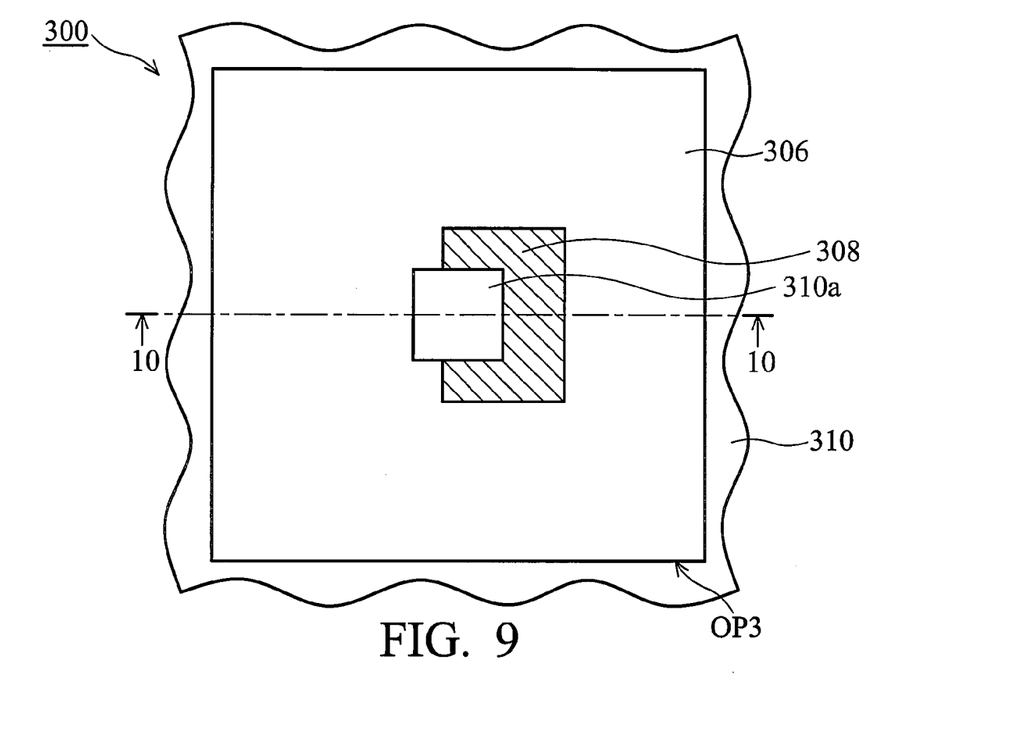
Figure 10:
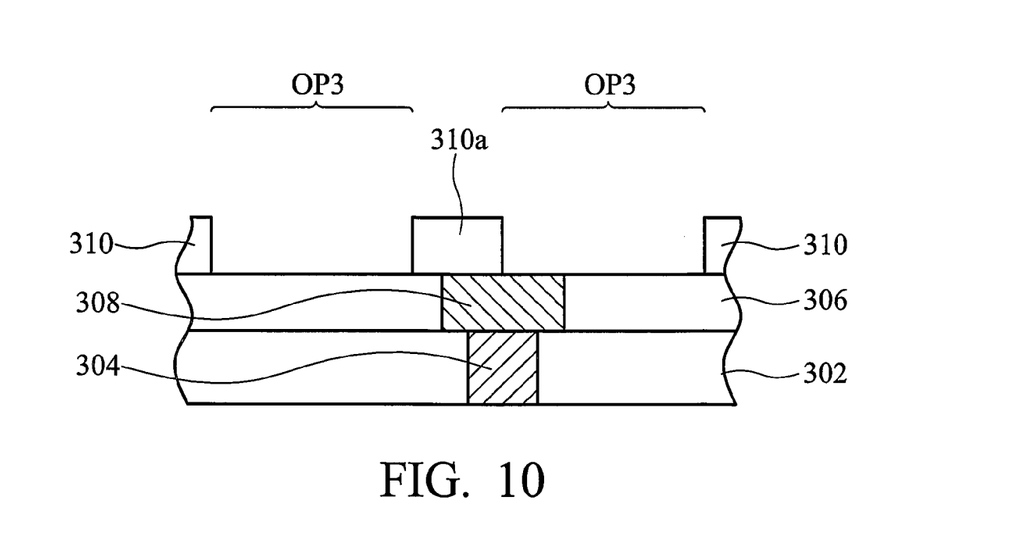

In FIGS. 9 and 10, an embodiment of a phase change memory device 300 is illustrated, wherein FIG. 9 shows a top view and FIG. 10 shows a cross section taken along line 10-10 in FIG. 9. Herein, a substantially fabricated phase change memory cell is first provided, comprising a first electrode 304 formed in a dielectric layer 302 and a patterned first phase change material layer 308 stacked over the dielectric layer 302. The first phase change material layer 308 is disposed in a dielectric layer 306 and a patterned dielectric layer 310 is formed over the first phase change material layer 308 and the dielectric layer 306, having an opening OP3 defined therein. The opening OP3 is formed around a dielectric plug 310a and the dielectric plug 310a partially overlaps the underlying first phase change material layer 308. The opening OP3 partially exposes the first phase change material layer 308 and the dielectric layer 306.

Figure 11:
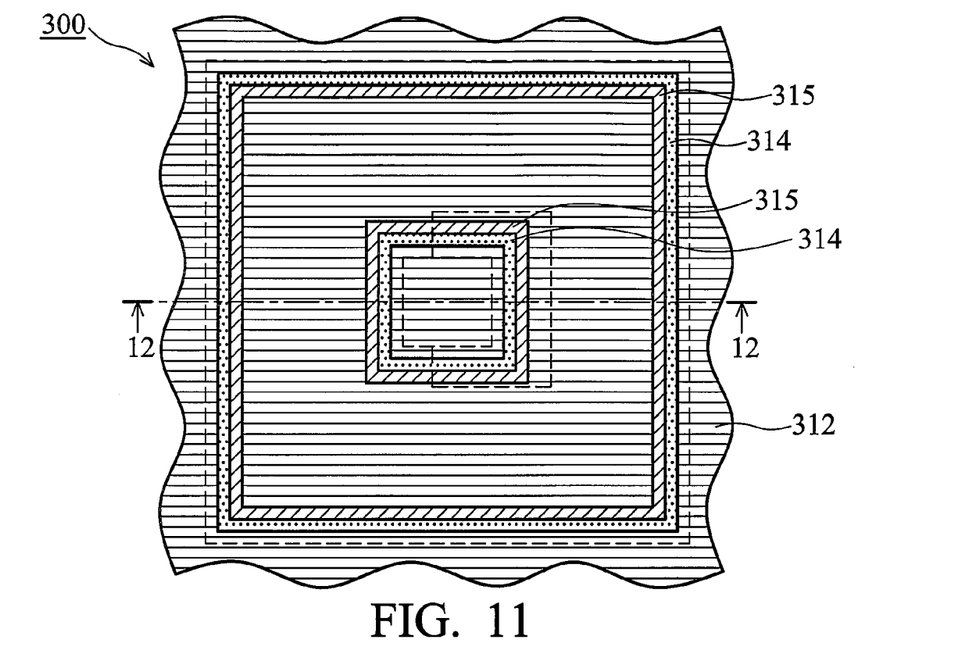
Figure 12:
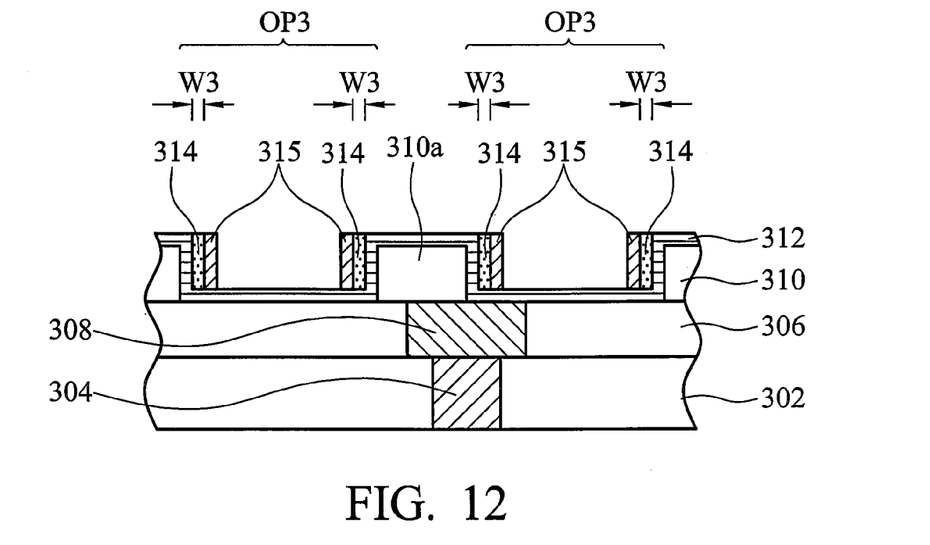

FIGS. 11 and 12 illustrate formation of a second phase change material layer 312, a protective layer 314 and a sacrificial layer 315 over the structure illustrated in FIGS. 9 and 10, respectively, wherein FIG. 12 shows a cross section taken along line 12-12 in FIG. 11.

As shown in FIGS. 11 and 12, a second phase change material layer 312 is conformably formed over the structures illustrated in FIGS. 9 and 10 and a layer of spacer material and sacrificial layer are sequentially formed over second phase change material layer 312. An etching step (not shown) is then performed to partially remove the layer of the sacrificial material and the spacer material, thereby leaving a spacer layer 314 and a sacrificial layer 315 over sidewalls of the second phase change material layer 312 in the opening OP3, wherein a thickness of the sacrificial layer 315 is not greater than that of a vertical portion of the second phase change material layer 312 formed over sidewalls of the dielectric plug 310a. The spacer layer 314 and the sacrificial layer 315 may comprise borophosphosilicate glass (BPSG), silicon oxide or spin on glass (SOG). The spacer layer 314 and the sacrificial layer 315 preferably comprise different dielectric material to thereby provide proper etching selectivity.

Figure 13:
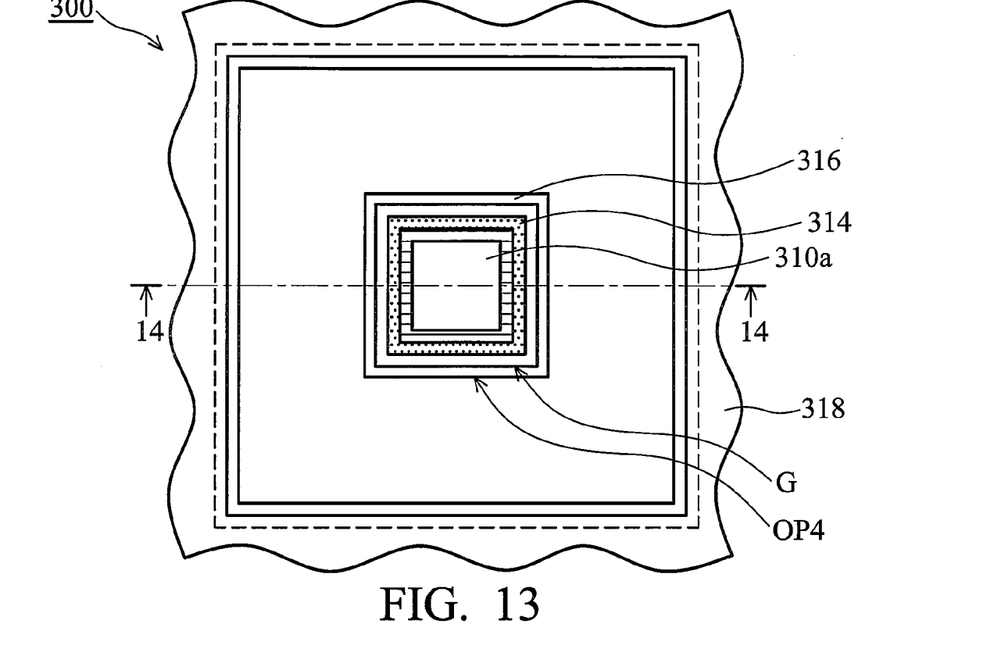
Figure 14:
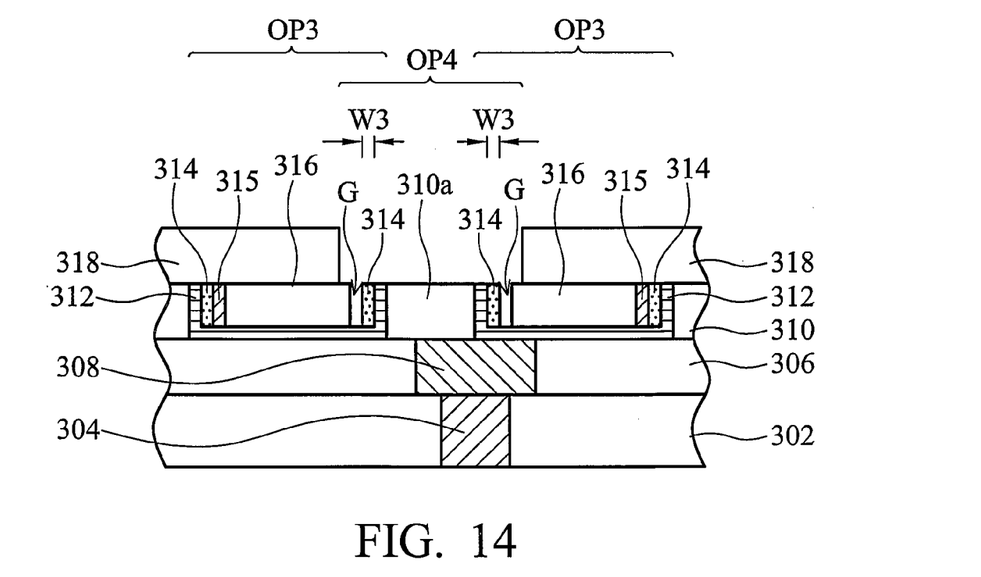

FIGS. 13 and 14 illustrate deposition of a dielectric material over the structures illustrated in FIGS. 11 and 12 and filling of the dielectric material into the opening OP3. The dielectric material may comprise borophosphosilicate glass (BPSG), silicon oxide or spin on glass (SOG). Next, a planarization step (not shown) such as a chemical mechanical polishing process is performed to remove the portion of the dielectric material and the second phase change material layer 312 overlying the dielectric layer 310 and the dielectric plug 310a, thereby leaving a dielectric layer 316 and the patterned second phase change material layer 312, the spacer layer 314, the sacrificial layer 315 and the dielectric layer 316 adjacent to the sacrificial layer 315. Herein, the dielectric layer 316 is now coplanar with the dielectric layer 310, the conductive plug 310a, the second phase change material layer 312, the spacer layer 314 and the sacrificial layer 315. A patterned dielectric layer 318 is next formed over the dielectric layers 310 and 316, the second phase change material layer 312 and the sacrificial layer 315. The dielectric layer 318 preferably comprises dielectric materials different from that of the dielectric layer 316, the spacer layer 314 and the sacrificial layer 315. The patterned dielectric layer 318 is formed with an opening OP4 therein by methods such as photolithography and etching steps (not shown). Herein, the opening OP4 is substantially formed over the dielectric plug 310a and partially exposes the second phase change material layer 312, the sacrificial layer 315, the spacer layer and portions of the dielectric layer 316. Next, a film removal process (not shown) such as an etching process is performed to remove the sacrificial layer 315 and forms a seam G between spacer layer 314 formed on sidewalls of the second phase change material layer 312 and adjacent dielectric layer 316. The seam G extends downward to the second phase change material layer 312, having a width W3 the same as that of the sacrificial layer 315.

Figure 15:
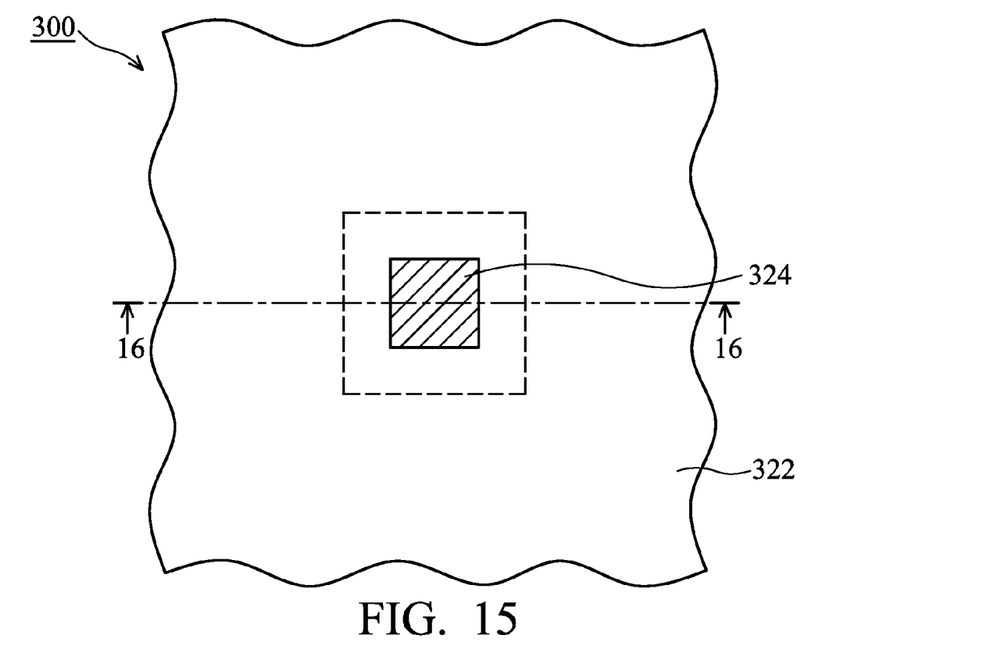
Figure 16:
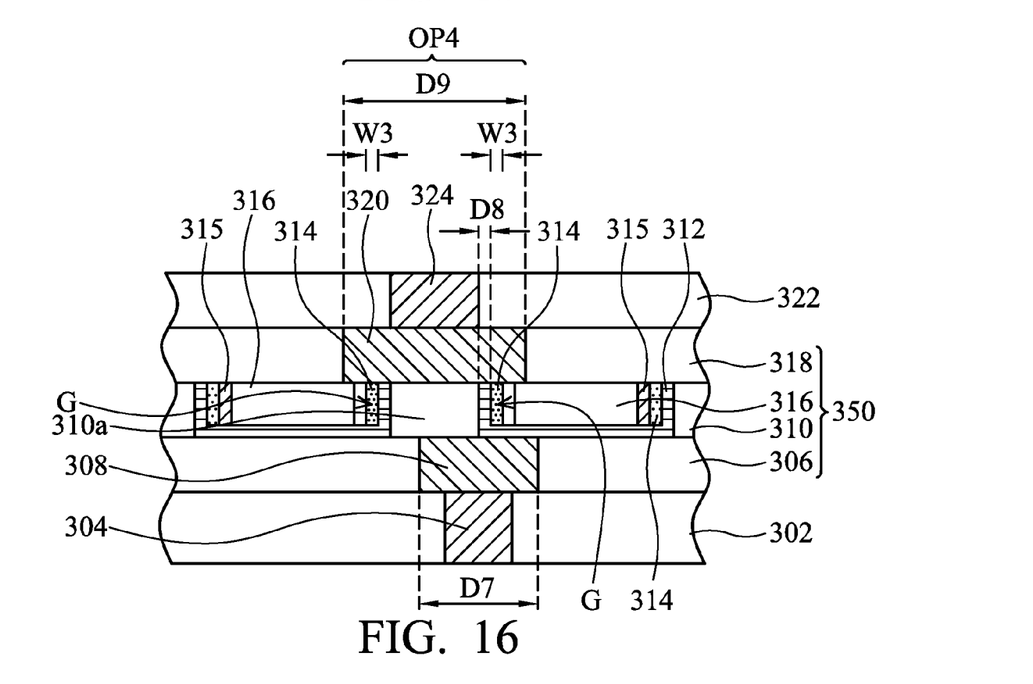

FIGS. 15 and 16 illustrate formation of a third phase change material layer 320 and a second electrode 324 over the structures illustrated in FIGS. 13 and 14, wherein FIG. 16 shows a cross section taken along line 16-16 in FIG. 15.

In FIGS. 15 and 16, a third phase change material layer 320 is next formed in the structure illustrated in FIGS. 13 and 14. The third phase change material layer 320 may comprise material the same as that of the first and second phase change material layers 308 and 312 and can be formed by methods such as PVD. Since PVD may be used, step coverage performance in the opening OP4 is not adequate and the seam G is formed with a small width, the third phase change material layer 320 thus may not be formed in the seam G during deposition thereof. Next, a dielectric layer 322 is formed over the dielectric layer 312 and the third phase change material layer 320, and an opening (not shown) is next formed in the dielectric layer 322 by sequential photolithography and etching steps (not shown). A second electrode 324 is subsequently formed in the opening.

As shown in FIG. 16, the third phase change material layer 320 the second phase change material layer 312 and the first phase change material layer 308 form a composite phase change material layer of the phase change memory cell, having a substantially I-shaped configuration in cross section. The third phase change material layer 320, the second phase change material layer 312 and the first phase change material layer 308 have a third width D9, second width D8 and first width D7, respectively, wherein the second width D8 is less than the third width D9 and the first width D7 and the third width D9 can be the same as or different from the first width D7. Preferably, the first width D7, the second width D8 and the third width D9 has a ratio of about 3~10:1~1:4~20. As shown in FIG. 16, the second phase change material layer 312 is formed with an L or reverse L ((⌐)) shaped configuration. The first electrode 304 and the second electrode 324 the phase change memory cell may function as a heating electrode. Those skilled in the art will recognize that the electrodes can be connected with other conductive components according to design. In this embodiment, the composite phase change material layer substantially comprises three phase change material sub-layers of different widths. Herein, a third sub-layer (i.e. the third phase change material layer 320) and the first sub-layer (i.e. the first phase change material layer 308) have a width greater than a second sub-layer (i.e. the second phase change material layer 312) in the composite phase change material layer. The phase change material layer of the described configuration allows current concentration at the second sub-layer and the adjacent portions thereof, thereby achieving a high current density for allowing progress of the writing operation there. Therefore, the second sub-layer may function as an active region for determining bit status. Moreover, the second sub-layer and adjacent dielectric layer 316 are now isolated by the seam G and the space in the seam G is now left with air or is under vacuum, thereby forming a gap G between the heating electrode and the dielectric layer 316. During writing operations, heat loss from the part of the phase change material layer heated by the heating electrode on the adjacent dielectric layer 316 can be prevented, thereby improving heating efficiency of the heating electrode and reducing power consumption when compared with the conventional phase change memory cell. In addition, the spacer layer 314 is formed over sidewalls of the second sub-layer of the composite phase change material layer provides a structural supplement to the overlying layer, thereby preventing collapse therein.

Figure 17:
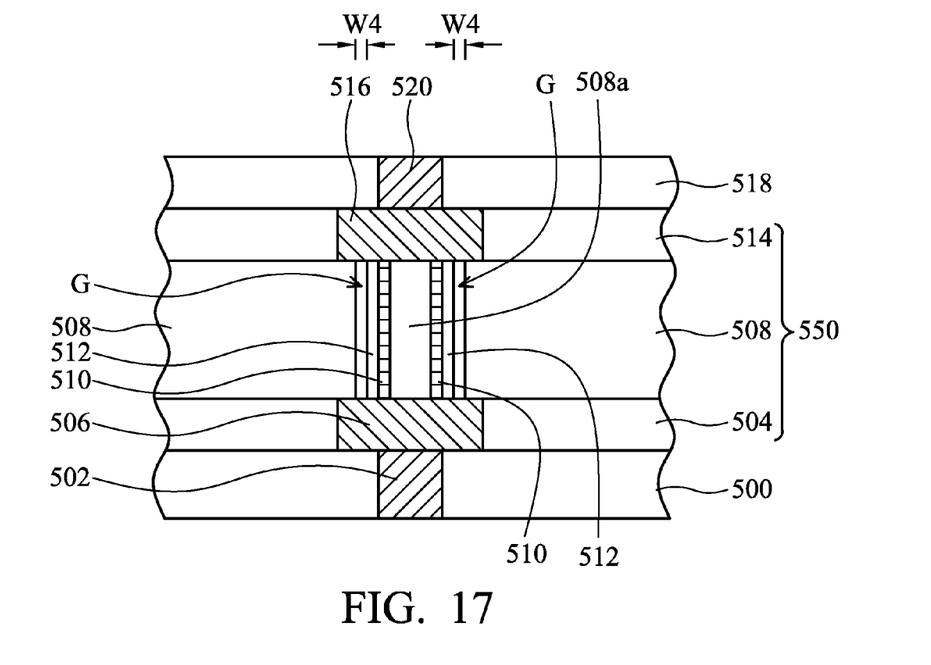
FIG. 17 is a schematic diagram showing another PCM device according to another embodiment of the invention.

FIG. 17 is a schematic diagram showing another PCM device according to another exemplary embodiment modified form of the exemplary embodiment of FIG. 16.

In FIG. 17, the phase change memory device comprises a first electrode 502 formed in the dielectric layer 500. A patterned composite phase change material layer and a second electrode 520 are sequentially formed over the dielectric layer 500. The composite phase change material layer comprises a sequentially stacked first phase change material layer 506, a second phase change material layer 510 embedded with a dielectric plug 508a therein and a third phase change material layer 516, substantially having an I-shaped configuration. The first phase change material layer 506 contacts the second phase change material layer 510 and a spacer layer 512 is formed between the second phase change material layer 510 and a gap G adjacent thereto. The Gap G preferably has a thickness W4 not greater than half the width of the dielectric plug 508a. Processes and materials for forming such PCM device are similar with those illustrated in FIGS. 9-16 and are not described here again, for simplicity.

The PCM device illustrated in FIG. 17 also has similar heating performance as those illustrated in FIGS. 4, 8 and 16. Heat loss issues of the conventional PCM cell as illustrated in FIGS. 1 and 2 are thus prevented, and heating performance and heating efficiency in a PCM cell is thus ensured and improved, thereby reducing power consumption thereof.

Through the illustration show in FIGS. 4, 8, 16 or 17, an exemplary phase change memory device is provided, comprising a first electrode (e.g. the electrode 106, 202, 304 or 502) disposed in a first dielectric layer (e.g. the dielectric layer 104, 200, 302 or 500), a second dielectric layer (e.g. the dielectric layer 108, a composite dielectric layer 250 comprising the dielectric layers 204, 214 and 216, a composite dielectric layer 350 comprising the dielectric layers 306, 310, 318 and 316, or a composite dielectric layer 550 comprising the dielectric layers 504, 508, and 514) is disposed over the first dielectric layer and the first electrode, a phase change material layer (e.g. the phase change material layer 112, the composite phase change material layer comprising phase change material sub-layers 206, 208 and 218, the composite phase change material layer comprising phase change material sub-layers 308, 312, and 320, or the composite phase change material layer comprising phase change material sub-layers 506, 510 and 516) disposed in the second dielectric layer to electrically connect the first electrode, a third dielectric layer (e.g. the dielectric layer 118, 220, 322, or 518) disposed over the second dielectric layer, a second electrode (e.g. the electrode 120, 222, 324, or 520) disposed in the third dielectric layer to electrically connect the phase change material layer and at least one gap (e.g. the gap G) disposed in the first dielectric layer or the second dielectric layer to thereby isolate portions of the phase change material layer and portions of the first or second dielectric layer adjacent thereto.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
a first electrode disposed in a first dielectric layer;
a second dielectric layer disposed over the first dielectric layer and the first electrode;
a phase change material layer disposed in the second dielectric layer, electrically contacting the first electrode;
a third dielectric layer disposed over the second dielectric layer;
a second electrode disposed in the third dielectric layer, electrically contacting the phase change material layer; and
at least one gap disposed in the first dielectric layer or the second dielectric layer, thereby isolating portions of the phase change material layer and portions of the first or second dielectric layer adjacent thereto.

2. The phase change memory device as claimed in claim 1, wherein the at least one gap is disposed in the second dielectric layer to isolate portions of a sidewall of the phase change material layer and the second dielectric layer.

3. The phase change memory device as claimed in claim 2, further comprising a spacer layer disposed between the sidewall of the phase change material layer and the at least one gap.

4. The phase change memory device as claimed in claim 1, wherein the at least one gap is disposed in the first dielectric layer to isolate portions of a bottom surface of the phase change material layer and the first dielectric layer.

5. The phase change memory device as claimed in claim 4, wherein the at least one gap is disposed on a sidewall of the first electrode to isolate the first electrode and the first dielectric layer.

6. A phase change memory device, comprising:
a first electrode disposed in a first dielectric layer;
a second dielectric layer disposed over the first dielectric layer and the first electrode;
an I-shaped phase change material layer disposed in the second dielectric layer, electrically contacting the first electrode, comprising;
a first portion contacting the first electrode, having a first width;
a second portion disposed on a portion of the first portion, having a second width;
a third portion disposed on the second portion and partially contacting the second portion, having a third width, wherein the second width is less than the first width and the third width;
a third dielectric layer disposed over the second dielectric layer and the I-shaped phase change material layer;
a second electrode disposed in the third dielectric layer, electrically contacting the third portion of the phase change material layer;
a spacer layer at least disposed between portions of the second portion of the I-shaped phase change material layer and the second dielectric layer; and
at least one gap disposed between the spacer layer and the second dielectric layer.

7. The phase change memory device as claimed in claim 6, wherein the second portion of the I-shaped phase change material layer has an L or reverse L ((⌐)) shaped cross section.

8. The phase change memory device as claimed in claim 6, further comprising a dielectric plug embedded in the second portion of the I-shaped phase change material layer, wherein the dielectric plug is merely in contact with the first and third portions of the I-shaped phase change material layer but not in contact with the spacer layer.

9. The phase change memory device as claimed in claim 8, wherein the second portion of the I-shaped phase change material layer surrounds sidewalls of the dielectric plug.

10. The phase change memory device as claimed in claim 6, wherein the I-shaped phase change material layer comprises chalcogenide materials.

11. The phase change memory device as claimed in claim 6, wherein the first and second electrodes comprise Ti, Al, Cu, W or alloys thereof.

12. A phase change memory device, comprising:
a first electrode disposed in a first dielectric layer;
a second dielectric layer disposed over the first dielectric layer and the first electrode;
a phase change material layer disposed in the second dielectric layer, electrically contacting the first electrode;
a third dielectric layer disposed over the phase change material layer and the second dielectric layer;
a second electrode disposed in the third dielectric layer, electrically contacting the phase change material layer; and
at least one gap disposed in the first dielectric layer, thereby isolating portions of a bottom surface of the phase change material layer with the first dielectric layer.

13. The phase change memory device as claimed in claim 12, wherein the at least one gap surrounds a sidewall of the first electrode to isolate the first electrode with the first dielectric layer adjacent to the first electrode.

* * * * *